(12) United States Patent
Minogue et al.

(10) Patent No.: US 7,427,527 B1
(45) Date of Patent: Sep. 23, 2008

(54) METHOD FOR ALIGNING DEVICES

(75) Inventors: Gerard Minogue, Rio Rancho, NM (US); Thomas P. Griego, Corrales, NM (US)

(73) Assignee: Surfect Technologies, Inc., Tempe, AZ (US)

( * ) Notice: Subject to any disclaimer, the term of this patent is extended or adjusted under 35 U.S.C. 154(b) by 203 days.

(21) Appl. No.: 11/058,005

(22) Filed: Feb. 14, 2005

Related U.S. Application Data

(60) Provisional application No. 60/544,834, filed on Feb. 13, 2004.

(51) Int. Cl.
*H01L 21/00* (2006.01)
(52) U.S. Cl. .................. 438/55; 438/613; 438/612; 438/116; 438/114
(58) Field of Classification Search ............. 438/14–15, 438/50–55, 116–106, 612–613
See application file for complete search history.

(56) References Cited

U.S. PATENT DOCUMENTS

| | | | | |
|---|---|---|---|---|
| 3,663,191 | A | * | 5/1972 | Kroder ..................... 428/643 |
| 4,120,758 | A | | 10/1978 | Rippere |
| 5,986,348 | A | | 11/1999 | Fukano |
| 6,056,844 | A | * | 5/2000 | Guiles et al. ............. 156/272.4 |
| 6,297,072 | B1 | * | 10/2001 | Tilmans et al. ............. 438/106 |
| 6,346,181 | B1 | | 2/2002 | Lee et al. |
| 6,402,923 | B1 | | 6/2002 | Mayer et al. |

* cited by examiner

*Primary Examiner*—Dung A. Le
(74) *Attorney, Agent, or Firm*—Haynes and Boone LLP

(57) ABSTRACT

A method is provided for aligning parts such as MEMS devices and photonics devices. One approach involves: providing between first and second parts a bonding material having fluid and solid states; applying a control field in the region of the bonding material, the bonding material changing its shape in direct response to changes in the control field while in the fluid state; adjusting the control field while the bonding material is in the fluid state so that the bonding material changes shape and causes relative movement of the first and second parts; and thereafter causing the bonding material to transition from the fluid state to the solid state while the first and second parts are in a selected position with respect to each other.

24 Claims, 3 Drawing Sheets

METHOD FOR ALIGNING DEVICES

CROSS-REFERENCE TO RELATED APPLICATIONS

This application claims the benefit of the filing of U.S. Provisional Patent Application Ser. No. 60/544,834, entitled "Method and Apparatus for Aligning MEMS and Photonics Devices", filed on Feb. 13, 2004 and the specification thereof is incorporated herein by reference.

BACKGROUND OF THE INVENTION

1. Field of the Invention (Technical Field)

The present invention relates to methods and apparatuses for device joining and alignment in the areas of solid state lasers, photonics and electronics packaging, optoelectronic and photonic devices, MEMS (Micro-Electro-Mechanical Systems), MOEMS (Micro-Opto-Electro-Mechanical Systems), and wafer scale bumping and joining.

2. Background Art

Note that the following discussion refers to a number of publications and references. Discussion of such publications herein is given for more complete background of the scientific principles and is not to be construed as an admission that such publications are prior art for patentability determination purposes.

Achieving optimum functionality of MEMS devices and photonic active devices such as solid state lasers, LEDs and other devices is dependent in part upon achieving and maintaining accurate spatial alignment of the device, in up to six degrees of freedom, relative to other components of the system such as optical fibers, optical waveguides, electrical conductors and other devices located on the substrate or within the package. In many cases, improper spatial alignment or alignment drift renders the device non-operational. Present strategies for device alignment focus primarily on simply orienting the components, bonding them and then attempting to adjust the alignment afterwards to improve the functionality of the device.

Other methods of aligning devices using magnetic fields are known; see for example U.S. Pat. No. 5,986,348. However, these methods typically require that both devices to be aligned have magnetic areas which are attracted to each other. The methods also are capable of aligning devices only in a predetermined arrangement, and cannot adjust the relative alignment in response to a measured signal.

SUMMARY OF THE INVENTION

Disclosure of the Invention

The present invention is a method for aligning one or more MEMS devices comprising the steps of depositing solder comprising ferromagnetic particles on a first MEMS device; disposing the first MEMS device on a stage; reflowing the solder; placing a second MEMS device adjacent to the solder; modifying a distribution of the particles in the solder, thereby moving the second MEMS device relative to the first MEMS device; measuring the relative alignment of the MEMS devices; and solidifying the solder when the desired relative alignment is achieved. The method preferably further comprises the step of metallizing areas of the first MEMS device for receiving the solder. The reflowing step preferably comprises heating the solder above its liquidus. The modifying step preferably comprises applying at least one magnetic field to the particles. The method preferably further comprises the step of moving the stage.

The measuring step preferably comprises producing a feedback signal, which is preferably used to control the application of one or more magnetic fields to the particles and/or to move the stage. The solidifying step preferably comprises rapidly cooling the solder. The method preferably further comprises the step of removeably affixing the first MEMS device to the stage. The method also preferably further comprises the step of depositing a ferromagnetic material directly on one or both of the MEMS devices. The invention is also an apparatus for aligning MEMS devices, the apparatus comprising a stage for receiving a first MEMS device comprising solder, a heater for reflowing the solder, and one or more magnetic field generators for modifying a distribution of ferromagnetic particles in the solder. The stage is preferably translatable and rotatable. The heater preferably comprises one or more heat producing devices selected from the group consisting of resistive heater, radiative heater, hot air heater, laser heater, and hot air heater. The generators are preferably selected from the group consisting of electromagnet, coil, and read/write head. The apparatus preferably further comprises a sensor, preferably a Q meter, for measuring output from the MEMS device. The apparatus preferably further comprises a feedback loop for controlling movement of the stage and/or the operation of the generators. The apparatus preferably further comprises a cooling source, preferably selected from the group consisting of chilled gas jet, cold finger, or Peltier TE cooler.

An object of the present invention is to provide for precise alignment of MEMS devices, even at submicron scales, without the use of complicated clamping and translational equipment.

An advantage of the present invention is that it may be incorporated into a feedback system for automated alignment.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes for Carrying Out the Invention

The present invention is a method and apparatus for aligning one or more MEMS devices using wafer scale solder bumping or joining. As used throughout the specification and claims, "MEMS device" means any device, package, or component thereof which requires accurate alignment to other devices, components, or packaging, including but not limited to lasers, photonics or electronics devices or packaging, opto-electronic devices, photonic devices, MEMS devices, MOEMS devices, and components thereof.

Figure 1:
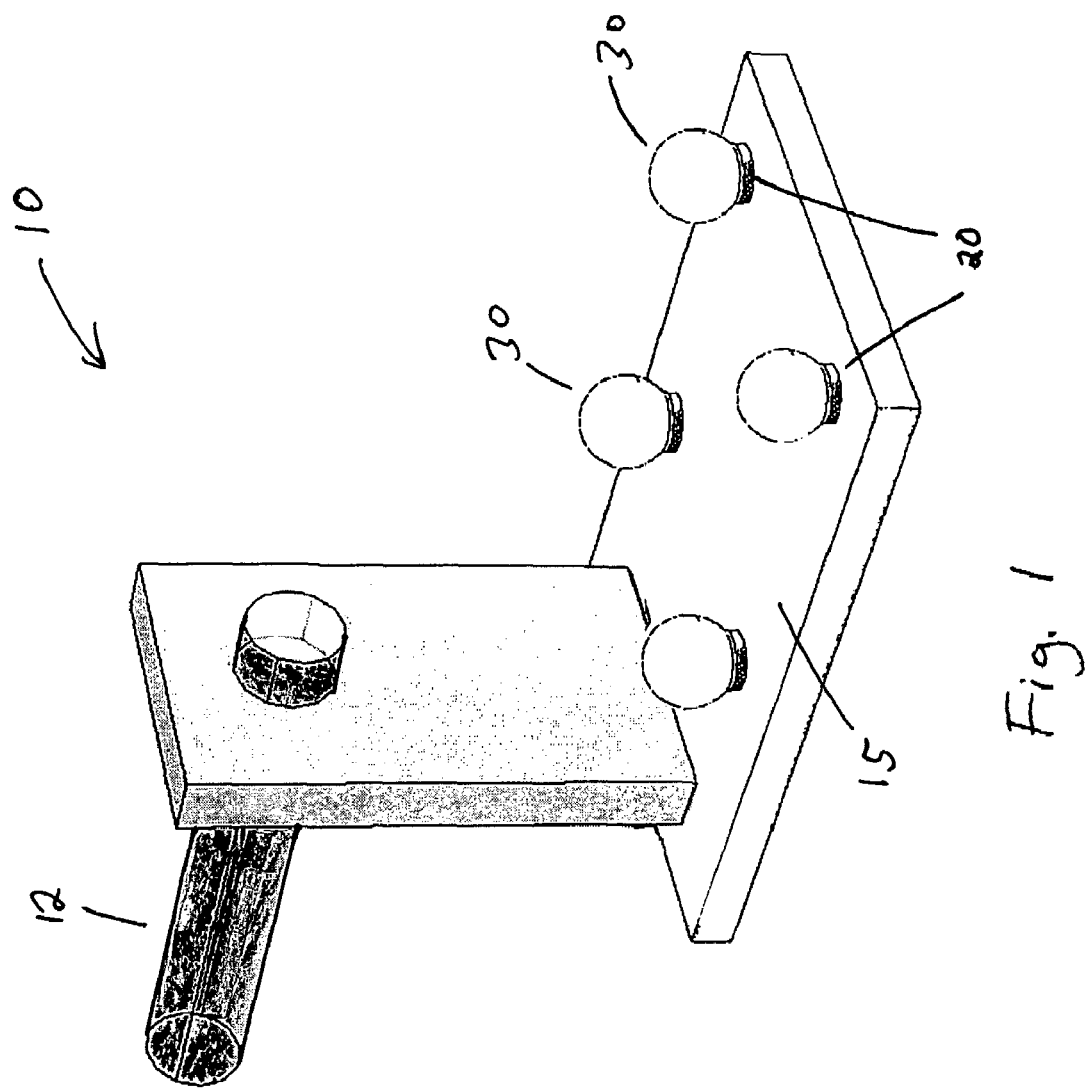
FIG. 1 depicts a MEMS device comprising a plurality of solder bumps.

As shown in FIG. 1, first MEMS device 10 is preferably pattern metallized on at least the edges or corners of surface 15 in such a manner as to facilitate solder wetting. Preferably at least three pad areas 20 are metallized, however only one or two pad areas may be used depending on the geometry of the components or MEMS devices being aligned. Metallization can be accomplished by any method known in the art, including but not limited to physical or chemical vapor deposition or electroless or electrolytic plating.

Solder bumps 30, preferably each comprising a controlled mass and volume of solder metals, are preferably subsequently deposited onto metallized pad areas 20 via a combination of electrochemical and magnetic means. These deposits are preferably produced from a fluidized bed of coated (preferably electroplated) ferromagnetic particles, preferably nickel particles, dispersed in a plating bath comprising a solder composition or precursor composition. These processes are more fully disclosed in commonly-owned U.S. patent application Ser. Nos. 10/728,636, entitled "Coated and Magnetic Particles and Applications Thereof", filed on Dec. 5, 2003; 10/778,647, entitled Apparatus and Method for Highly Controlled Electrodeposition", filed on Feb. 12, 2004; and 09/872,214, entitled "Submicron And Nano Size Particle Encapsulation by Electrochemical Process and Apparatus", filed on May 31, 2001, the entirety of which applications are incorporated herein by reference.

The metal coating the ferromagnetic particles and the metal deposited from the plating bath are preferably chosen in such a way as to result in a composite plating deposit consisting of the constituent metals of the final desired solder alloy having the desired mass proportions. The process conditions are preferably chosen in such a manner as to result in a solder deposit in which the constituent metals are present in the correct mass percentage ratio. For example, in the case of a Sn—Pb eutectic solder, the particle coating is chosen to comprise Sn, and the coating thickness and particle density codeposited with the metal plated from the bath (which in this example is chosen to comprise Pb) are adjusted in such a way as to create a final deposit consisting of 63 mass percent Sn and 37 mass percent Pb, which is the eutectic composition. Optionally, either or both of the particle coating and the bath metal may each comprise both Sn and Pb. This process can be used with any solder metal system as long as the metals can be electroplated or catalytically (electrolessly) plated. Such systems include Au—Sn, In—Sn, and Ag—Cu solder compositions as well as many other eutectic and non-eutectic compositions.

The particles may optionally be uncoated, with the plating bath comprising the final solder composition. This variation is not preferred, however, since an intermetallic reaction can occur between the solder and particle, resulting in unpredictable uniformity and wetting properties.

Figure 2:
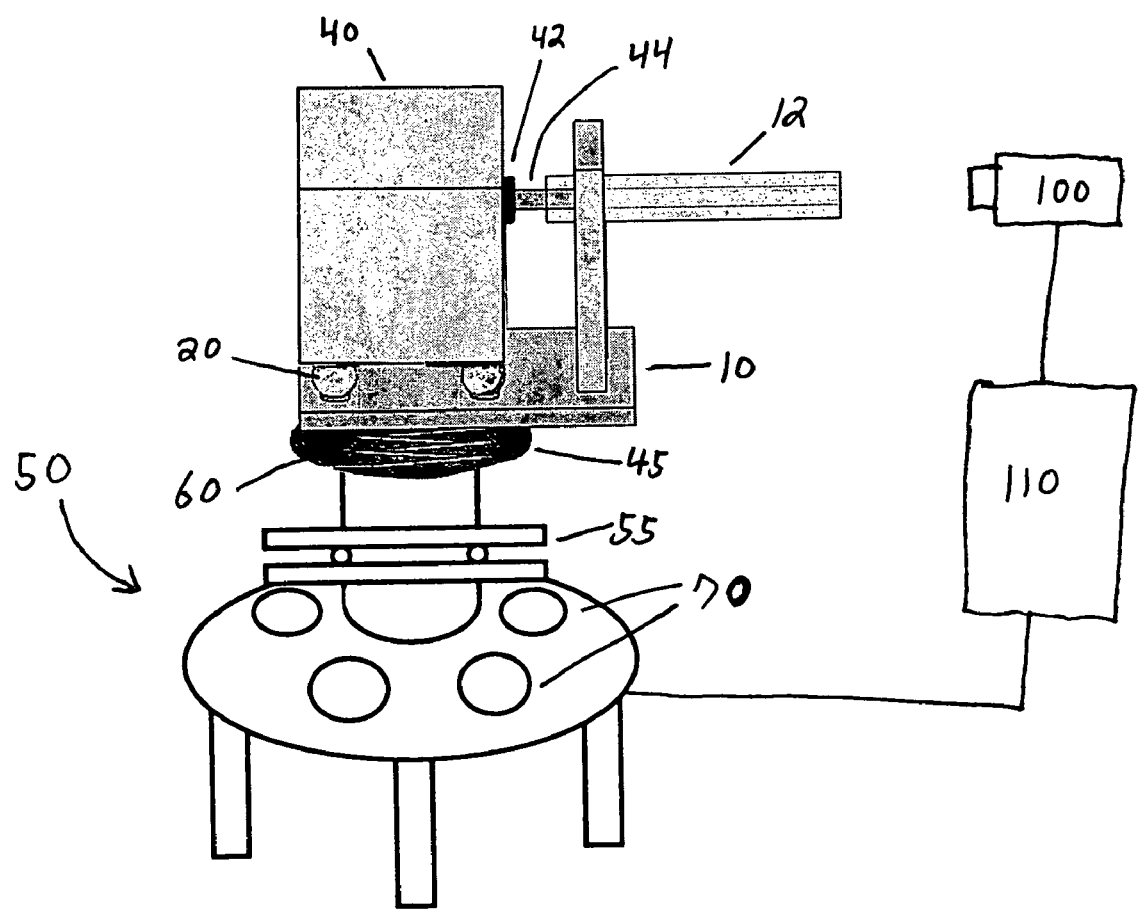
FIG. 2 depicts a second MEMS device to be aligned to the MEMS device of FIG. 1, which is disposed on an alignment fixture.

As shown in FIG. 2, once first MEMS device 10 has been suitably solder bumped or solder patterned it is positioned on stage 45 of mechanical fixture 50 and is preferably removably affixed thereto. Such attachment is preferably provided by clamping or an equivalent method which provides both stability and good thermal contact between first MEMS device 10 and stage 45. Stage 45 preferably incorporates one or more heating elements 60 having sufficient power to heat the solder above its liquidus temperature. Heating elements 60 preferably utilize resistive heating, although other methods of heating, including but not limited to laser heating, radiative (preferably infrared) heating, hot air heating or any combination thereof may be used in addition to or in place of resistive element heating. Second MEMS device 40 is placed in contact with solder bumps 30 in roughly the desired alignment with first MEMS device 10, either before or after the solder in solder bumps 30 is reflowed by heating it above its liquidus. In FIG. 2, for illustration purposes only, second MEMS device 40 comprises semiconductor laser 42, whose output beam 44 will preferably be optimally aligned with optical fiber 12 of first MEMS device 10. However, alignment of any types of MEMS devices or components is contemplated.

Fixture 50 also preferably incorporates an array of one or more magnetic field generators 70. The actual configuration of the array may be the same as depicted in FIG. 2 or different. Depending on the configuration and field strength desired, generators 70 may comprise electromagnets, coils, disk drive read/write heads, and the like, or any combination thereof. Generators 70 are preferably arranged so that when one or more generators 70 are controllably activated, the positions and/or distribution of the ferromagnetic particles within reflowed solder bumps 30 are modified as desired. Because of the surface tension between these particles and the solder, this results in the ability to finely control, even at micron at sub-micron scales, the positions and shapes of solder bumps 30, thereby aligning MEMS devices 10, 40 relative to one another. Thus, the position, angle and magnitude of the magnetic forces can be adjusted as desired to achieve the proper and desired device orientation.

Figure 3:
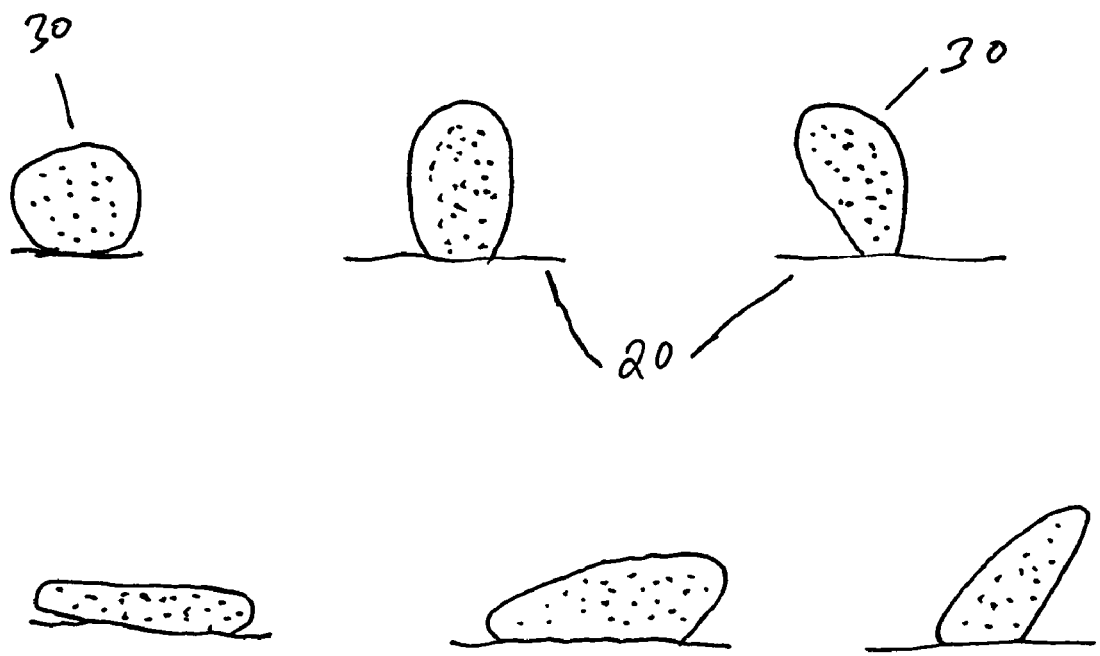
FIG. 3 shows various particle distributions and solder bump shapes which can be achieved by applying magnetic fields as desired.

FIG. 3 depicts some examples of particle distributions and solder bump shape variations. In addition to changing the shapes of solder bumps 30, their positions are preferably variable in all six degrees of freedom (three linear, three angular), and generators 70 are preferably arranged to provide such variation. Depending on the devices to be aligned or other requirements, the positions of generators 70 may optionally be customizeable and/or variable.

Magnetic susceptibility may also be imparted to a MEMS device by depositing a layer or region of ferromagnetic material directly onto the device, preferably via conventional electroplating or catalytic (electroless) plating, or by CVD, PVD or PCVD deposition, in place of or in addition to the codeposition of ferromagnetic particles as solder alloy constituents as described above.

Mechanical fixture 50 preferably incorporates fine linear motion control in three axes plus fine angular motion control in three axes to afford six degrees of freedom for stage 45. Such control may optionally be provided by, for example, translation stages 55 coupled with computer-controlled stepper motors. By providing this additional adjustment capability to MEMS device 10, coarse or fine tuning of the magnetic field orientations and field strengths experienced by the ferromagnetic particles in solder bumps 30 is enabled, for example by varying the angle or distance of MEMS device 10 relative to one or more of magnetic field generators 70.

The MEMS device being aligned is preferably connected to a driver circuit or apparatus sufficient to energize the device and detect its output for functional testing during the placement and alignment process. The quality of the output from the energized MEMS device is preferably detected by sensor 100 and used in real time via algorithms known in the art to provide active feedback to the positioning apparatus control system 110, which optionally comprises a computer or other processor and adjusts the position and orientation of the MEMS device so as to optimize (typically, maximize) the device output. Such adjustment is preferably automatic, although manual adjustment is optionally performed. Alternatively, an external active device such as a laser may be used to align two or more passive MEMS devices. One or more detectors may optionally be employed to functionally evaluate the device output quality during and after the placement process.

For example, the power of laser emissions, either directly from the laser source or as routed through an optical fiber, is commonly measured using a Q (emission power) meter. The quality of the alignment of the laser source to the optical fiber or other device can be assessed as a function of the ratio of the laser energy emitted by the source to the laser energy measured at the reference target after passing through the optical fiber or other optical device. In practice, the incident power is measured in real time and the alignment of the components is adjusted until the alignment resulting in a maximum power reading is achieved. This alignment is then considered optimal for optical transmission.

Once the MEMS device output quality has been optimized as above, the solder is preferably rapidly cooled to the solidus stage, thereby fixing the optimally aligned MEMS device(s) in place. This cooling may be performed by use of various means known in the art, including but not limited to localized cooling sources such as chilled gas jets, cold fingers, or Peltier TE coolers.

Although the invention has been described in detail with particular reference to these preferred embodiments, other embodiments can achieve the same results. Variations and modifications of the present invention will be obvious to those skilled in the art and it is intended to cover all such modifications and equivalents. The entire disclosures of all patents and publications cited above are hereby incorporated by reference.

What is claimed is:

1. A method for aligning one or more MEMS devices, the method comprising the steps of:
   depositing solder comprising ferromagnetic particles on a first MEMS device;
   disposing the first MEMS device on a stage;
   reflowing the solder;
   placing a second MEMS device adjacent to the solder;
   modifying a distribution of the particles in the solder, thereby moving the second MEMS device relative to the first MEMS device;
   measuring the relative alignment of the MEMS devices; and
   solidifying the solder when the desired relative alignment is achieved.

2. The method of claim 1 further comprising the step of metallizing areas of the first MEMS device for receiving the solder.

3. The method of claim 1 wherein the reflowing step comprises heating the solder above its liquidus.

4. The method of claim 1 wherein the modifying step comprises applying at least one magnetic field to the particles.

5. The method of claim 1 further comprising the step of moving the stage.

6. The method of claim 1 wherein the measuring step comprises producing a feedback signal.

7. The method of claim 6 wherein the feedback signal is used to control the application of one or more magnetic fields to the particles.

8. The method of claim 6 wherein the feedback signal is used to move the stage.

9. The method of claim 1 wherein the solidifying step comprises rapidly cooling the solder.

10. The method of claim 1 further comprising the step of removeably affixing the first MEMS device to the stage.

11. The method of claim 1 further comprising the step of depositing a ferromagnetic material directly on one or both of the MEMS devices.

12. A method comprising:
    providing a bonding material between first and second parts, the bonding material having a fluid state and a solid state;
    causing the bonding material to be in the fluid state;
    applying a control field in the region of the bonding material, the bonding material changing its shape in direct response to changes in the control field while the bonding material is in the fluid state;
    adjusting the control field while the bonding material is in the fluid state so that the bonding material changes shape and causes relative movement of the first and second parts; and
    thereafter causing the bonding material to transition from the fluid state to the solid state while the first and second parts are in a selected position with respect to each other.

13. The method according to claim 12,
    wherein the applying of the control field includes generating the control field with field generating structure that is separate from said first and second parts;
    including supporting the first part for movement relative to the field generating structure; and
    wherein the adjusting of the control field includes at least one of changing the control field generated by the field generating structure and moving the first part relative to the field generating structure.

14. The method according to claim 13, including configuring the field generating structure to include a plurality of spaced field generators that each generate a respective component field, the component fields collectively defining the control field.

15. The method according to claim 14, wherein the adjusting of the control field includes changing at least one of the component fields.

16. The method according to claim 12, including:
    generating a feedback signal representative of the relative position of the first and second parts; and
    carrying out the adjusting of the control field as a function of the feedback signal.

17. The method according to claim 16, including:
    emitting an optical signal from first structure in the first part;
    receiving the optical signal with second structure in the second part; and
    carrying out the generating of the feedback signal in the second structure as a function of the received optical signal.

18. The method according to claim 12, including:
    heating the bonding material to cause the bonding material to be in the fluid state, and
    cooling the bonding material to cause the bonding material to be in the solid state.

19. The method according to claim 12, including configuring the bonding material to include particles that are directly influenced by the control field.

20. The method according to claim 19,
    including configuring the particles to be responsive to a magnetic field; and
    wherein the generating of the control field is carried out in a manner that includes generating a magnetic field.

21. The method according to claim 20, including configuring the bonding material to include a solder, the first and second parts each having a metallized portion that is engaged by the solder.

22. The method according to claim 12, including configuring the bonding material to include a solder, the first and second parts each having a metallized portion that is engaged by the solder.

23. The method according to claim 12, wherein the first part is one of a laser device, a photonic device, an electronic device, an optoelectronic device, and a MEMS device.

24. The method according to claim 23, wherein the second part is one of a laser device, a photonic device, an electronic device, an optoelectronic device, and a MEMS device.

* * * * *